US010151957B2

(12) United States Patent
Xu

(10) Patent No.: US 10,151,957 B2
(45) Date of Patent: Dec. 11, 2018

(54) ARRAY SUBSTRATE AND LIQUID CRYSTAL DISPLAY PANEL

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 247 days.

(21) Appl. No.: 15/101,046

(22) PCT Filed: May 9, 2016

(86) PCT No.: PCT/CN2016/081460
§ 371 (c)(1),
(2) Date: Jun. 2, 2016

(87) PCT Pub. No.: WO2017/177486
PCT Pub. Date: Oct. 19, 2017

(65) Prior Publication Data
US 2018/0101077 A1 Apr. 12, 2018

(30) Foreign Application Priority Data
Apr. 13, 2016 (CN) .......................... 2016 1 0231670

(51) Int. Cl.
*G09G 3/36* (2006.01)
*G02F 1/1362* (2006.01)
*H01L 27/12* (2006.01)

(52) U.S. Cl.
CPC .... *G02F 1/136286* (2013.01); *G02F 1/13624* (2013.01); *G09G 3/3688* (2013.01); *H01L 27/124* (2013.01); *G09G 2300/0804* (2013.01)

(58) Field of Classification Search
CPC ............ G02F 1/136286; H01L 27/124; G09G 3/3688; G09G 3/2983; G09G 2300/0804; G09G 2300/0885; G09G 2300/089; G09G 2310/0262
See application file for complete search history.

(56) References Cited

U.S. PATENT DOCUMENTS

2005/0001805 A1* 1/2005 Jeon ................... G02F 1/136286
345/92
2015/0042692 A1* 2/2015 Kim ..................... G09G 3/3233
345/690

* cited by examiner

*Primary Examiner* — Srilakshmi K Kumar
*Assistant Examiner* — Brent D Castiaux
(74) *Attorney, Agent, or Firm* — Andrew C. Cheng

(57) ABSTRACT

The present disclosure provides an array substrate and a liquid crystal display panel. The array substrate includes a plurality of gate line unit and a plurality of data and common signal multiplexing line, the adjacent data and common signal multiplexing lines and a gate line unit form a pixel region, a first switch unit, a second switch unit, a common electrode and a pixel electrode are arranged in the pixel region, the switch unit includes a gate electrode, a source electrode and a drain electrode. The source electrodes connect the same data and common signal multiplexing line, the data and common signal multiplexing line receives the data and common multiplexing signal, the data and common multiplexing signal, the first gate electrode and the second electrode are used to control the first switch unit and the second switch unit not open at same time.

18 Claims, 5 Drawing Sheets

ARRAY SUBSTRATE AND LIQUID CRYSTAL DISPLAY PANEL

CROSS REFERENCE

The present disclosure claims the priority of No. 201610231670.3, entitled "Array substrate and liquid crystal display panel", filed on Apr. 13, 2016, the disclosure of which is incorporated herein by reference in its entirety.

FIELD OF THE DISCLOSURE

The present disclosure relates to a liquid crystal display field, and more particularly to an array substrate and a liquid crystal display panel.

BACKGROUND OF THE DISCLOSURE

The liquid crystal display device is widely used because it has the advantage of small size, light weight, low power consumption, etc. The liquid crystal display device usually includes a liquid crystal display panel and a back light module, the back light module is used to provide area light source for liquid crystal display panel. The In-Plane Switching (IPS) mode display of the liquid crystal display (also called in-plane switching mode) is a mode of using an electric field component substantially parallel to the substrate to the liquid crystal molecules responding along the in-plane direction of the substrate. Because the IPS liquid crystal display panel has the advantage of viewing angle, is widely used in various display purposes. In the IPS mode of the liquid crystal display panel, a multi-dimensional is formed by a parallel electric field generated by the edge of the pixel electrode or the common electric and a longitudinal electric field generated between the pixel electrode and the common electrode, so that the liquid crystal cell between the pixel electrode or the common electrode, the pixel electrode or the common electrode orientation of the liquid crystal molecules just above all can generate a rotary converter, thereby improving the crystal plane orientation system efficiency, and increasing the light transmission efficiency. However, the array substrate in the conventional IPS liquid crystal display panel is using common electrode (COM) line to provide driving voltage to the common electrode, further, the common electrode line and the gate electrode line are made by the same metal layer. Due to the nature of the metal opaque, reducing the light transmittance of the array substrate, i.e. decreasing the aperture ratio of the array substrate.

SUMMARY OF THE DISCLOSURE

The present disclosure provides an array substrate, the array substrate includes a plurality of gate line units and a plurality of data and common signal multiplexing lines, the plurality of gate line units are extend the first direction and are arranged spaced alone the second direction, each gate line unit includes a first gate line and a second gate line, the data and common signal multiplexing lines are extend to the second direction and are arranged spaced alone the first direction, the adjacent data and common signal multiplexing lines and the first gate line and the second gate line in the gate line unit are form a pixel region, a first switch unit, a second switch unit, a common electrode and a pixel electrode are arranged in the pixel region, the first switch unit includes a first gate electrode, a first source electrode and a first drain electrode, the second switch unit includes a second gate electrode, a second source electrode and a second drain electrode, the first gate electrode connects the first gate line to receive a first gate electrode signal, the second gate electrode connects the second gate line to receive a second gate electrode signal, the first source electrode and the second source electrode are connected to form the same data and common signal multiplexing line of the pixel region, the first drain electrode connects the common electrode, the second drain electrode connects the pixel electrode, wherein, the pixel electrode is arranged with the common electrode in an insulated mode, the data and common signal multiplexing line is used to receive the data and common multiplexing signal, the data and common multiplexing signal, the first gate electrode signal and the second gate electrode signal are used to control the first switch unit and the second switch unit not opened at same time.

Wherein, the data and common multiplexing signal, the first gate electrode signal and the second gate electrode signal are used to switch on the first switch unit first to charge the common electrode, then open the second switch unit to charge the pixel electrode.

Wherein, the data and common multiplexing signal, the first gate electrode signal and the second gate electrode signal are used to switch on the second switch unit first to charge the pixel electrode, then switch on the first switch unit to charge the common electrode.

Wherein, the data and common multiplexing signal is a rectangular wave signal, in a period of the rectangular wave, the duration of the high level of the rectangular wave is greater than the duration of the low level of the rectangular wave, the first gate electrode signal and the second electrode signal are high level signal and the duration of the high level of the first gate electrode signal and the second electrode signal are equal, the duration of the high level of the first gate electrode signal is great than the duration of the high level in a period of the data and common multiplexing signal, and a gate line for the same unit, the delay time of the second gate electrode signal compared to the first gate electrode signal is equal to the duration of the high level of the first gate electrode signal.

Wherein, the array substrate further includes a signal switching unit, each signal switching unit connects a data and common signal multiplexing line, the signal switching unit is used to receive a common signal and a data signal, and the data and common multiplexing signal is generated by the common signal and the data signal, wherein, the common signal, the first gate electrode signal and the second gate electrode signal are used to control the first switch unit to charge the common electrode, the data signal, the first gate electrode signal and the second gate electrode signal are used to control the second switch unit to charge the pixel electrode.

Wherein, the data signal is a rectangular wave signal, in a period of the rectangular wave, the duration of the high level of the rectangular wave is less than the duration of the low level of the rectangular wave.

Wherein, the array substrate includes a common electrode line, a first signal line and a second signal line, the signal switching unit includes a plurality of switching groups, the common electrode line is used to receive the common signal, the first signal line is used to receive the first signal, the first signal is a square wave signal, the second signal line is used to receive the second signal, wherein, the second signal is an inverted signal through the first signal, the switching groups includes a third switch unit and a fourth switch unit, the third switch unit includes a third gate electrode, a third source electrode and a third drain electrode, the third gate electrode connects the first signal line, the third source electrode connects the data and common signal multiplexing line, the third drain electrode is used to receive the data signal, the fourth switch unit includes a fourth gate electrode, a fourth source electrode and a fourth drain electrode, the fourth gate electrode connects the second signal, the fourth source electrode connects the common electrode line for receiving the common signal, the fourth drain connects the third drain electrode.

Wherein, the signal switching unit, the common electrode line, the first signal line and the second signal line are on the non-display area of the array substrate.

Wherein, the array substrate includes a data signal generating chip and a common signal generating chip, the data signal generating chip is used to generate the data signal, the common signal generating chip is used to generate the common signal, the data signal generating chip and the common signal generating chip are on the non-display area of the array substrate.

The present disclosure further provides a liquid crystal display panel, the liquid crystal display panel including any one of the preceding array substrate.

Compared with the priority art, the array substrate of the present disclosure includes a plurality of data and common signal multiplexing lines, the data and common signal multiplexing lines receives a data and common multiplexing signal, the data and common multiplexing signal, the first gate electrode signal and the second gate electrode signal are used to control the first switch and the second switch in the same pixel region (pixel unit) not opened at same time. Thus, the array substrate of the present disclosure is not need as in the prior art using the public electro line and the gate electro line generated by the same layer, therefore, the array substrate of the present disclosure reducing the number of metal lines, increasing the transmittance of the array substrate and the aperture ratio of the array substrate.

BRIEF DESCRIPTION OF THE DRAWINGS

In order to more clearly illustrate the embodiments or the prior art technical solutions embodiment of the present disclosure, it will implement the following figures for the cases described in the prior art or require the use of a simple introduction, obviously, in the following description the drawings are only some embodiments of the present disclosure, those of ordinary skill in speaking, without creative efforts of the premise, you can also obtain other drawings based on these drawings.

DETAILED DESCRIPTION OF PREFERRED EMBODIMENTS

The present disclosure will now be combined with the implementation of the drawings, were a clear example of the technical solutions of the present disclosure, a complete description of, obviously, the described embodiments are only part of the embodiments of the present disclosure, but not all embodiments Example. Based on the embodiments of the present disclosure, those of ordinary skill in making all other embodiments no creative effort obtained are within the scope of protection of the present disclosure.

Figure 1:
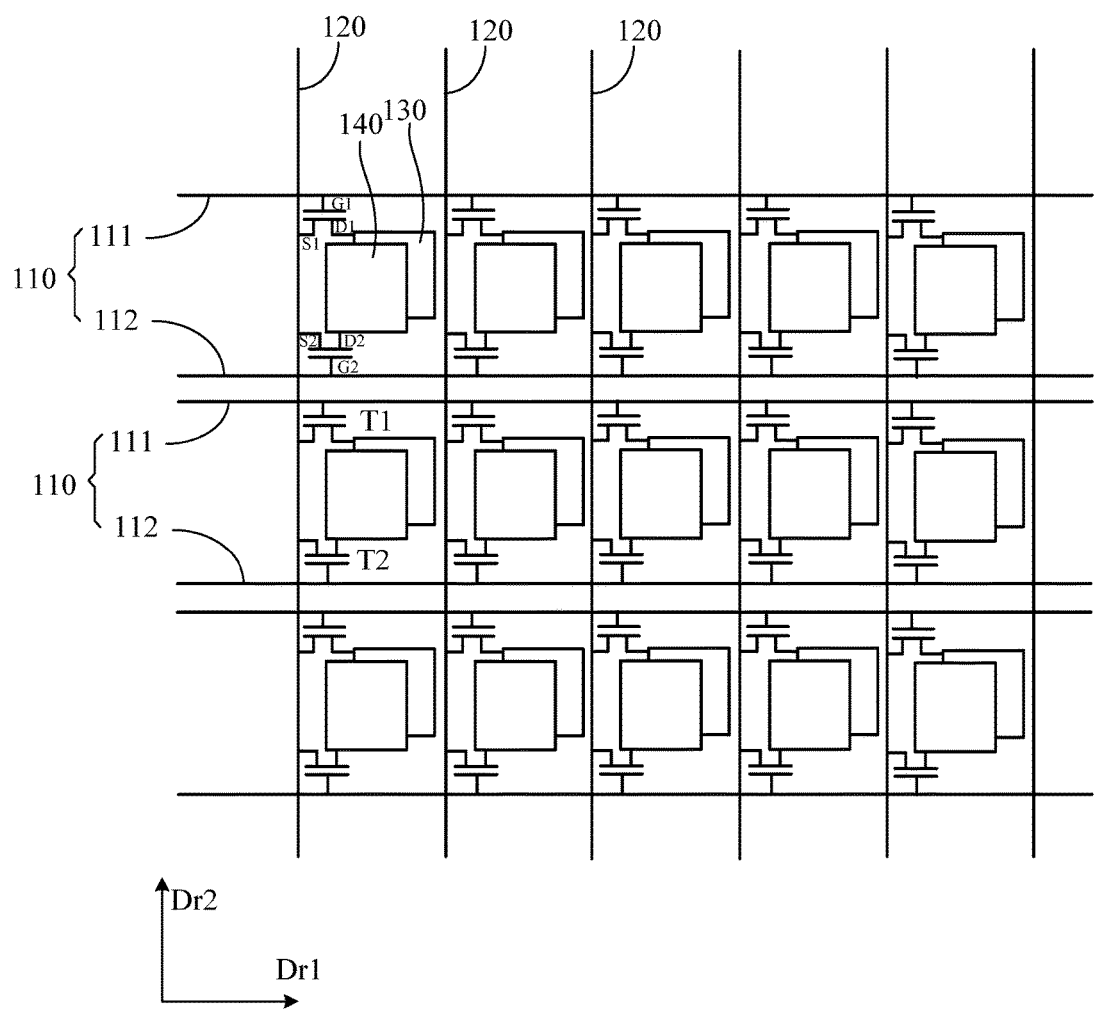
FIG. 1 is a schematic structural view of a preferred embodiment of the array substrate of the present disclosure.
Figure 2:
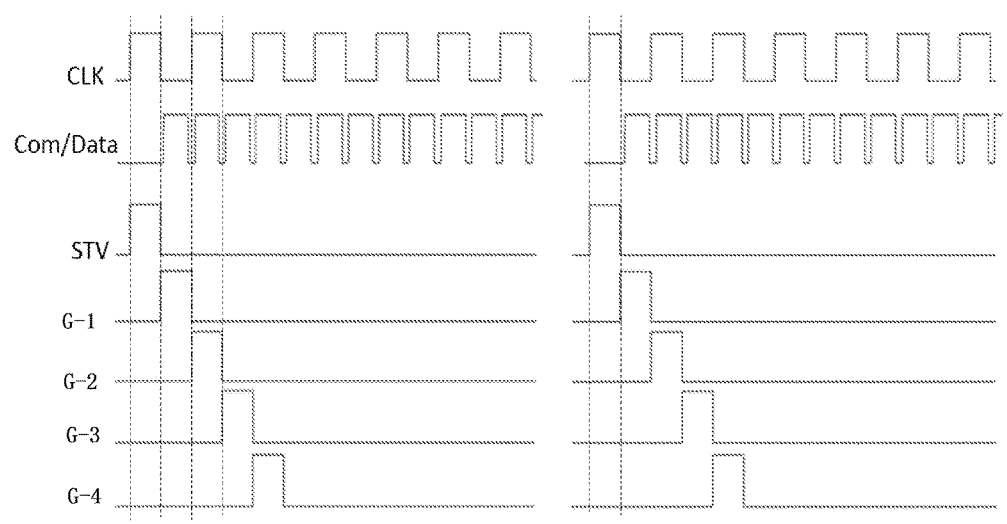
FIG. 2 is a timing diagram of each signal of the array substrate in the FIG. 1.

Refer to FIG. 1 and FIG. 2, FIG. 1 is a schematic structural view of a preferred embodiment of the array substrate of the present disclosure; FIG. 2 is a timing diagram of each signal of the array substrate in the FIG. 1. The array substrate 10 includes a plurality of gate line unit 110 and a plurality of data and common signal multiplexing lines 120. The gate line unit 110 is extends the first direction Dr1 and arranged spaced alone the second direction Dr2, each gate line unit 110 includes a first gate line 111 and a second gate line 112. The data and common signal multiplexing line 120 is extends the second direction Dr2 and arranged spaced alone the first direction Dr1, the adjacent data and common signal multiplexing lines 120 and the first gate line 111 and the second gate line 112 in the gate line unit 110 are form a pixel region, a first switch unit T1, a second switch unit T2, a common electrode 130 and a pixel electrode 140 are arranged in the pixel region. The first switch unit T1 includes a first gate electrode G1, a first source electrode S1 and a first drain electrode D1, the second switch unit T2 includes a second gate electrode G2, a second source electrode S2 and a second drain electrode D2. The first gate electrode G1 connects the first gate line 111 to receive a first gate electrode signal, the second gate electrode G2 connects the second gate line 112 to receive a second gate electrode signal, the first source electrode S1 and the second source electrode S2 are connected to form the same data and common signal multiplexing line 120 of the pixel region, the first drain electrode D1 connects the common electrode 130, the second drain electrode D2 connects the pixel electrode 140, wherein, the pixel electrode 140 is arranged with the common electrode 130 in an insulated mode, the data and common signal multiplexing line 120 is used to receive the data and common multiplexing signal, the data and common multiplexing signal, the first gate electrode signal and the second gate electrode signal are used to control the first switch unit T1 and the second switch unit T2 not opened at same time.

In the present embodiment, the first direction Dr1 is X-axis direction, the second direction Dr2 is Y-axis direction. Understandably, in another embodiment, the first direction Dr1 is Y-axis direction, the second direction Dr2 is X-axis direction.

Specifically, in an embodiment, the data and common multiplexing signal, the first gate electrode signal and the second gate electrode signal are used to switch on the first switch unit T1 first to charge the common electrode 130, then open the second switch unit T2 to charge the pixel electrode 140, and the first switch unit T1 and the second switch unit T2 are not opened at same time.

Specifically, in another embodiment, the data and common multiplexing signal, the first gate electrode signal and the second gate electrode signal are used to switch on the second switch unit T2 first to charge the pixel electrode 140, then to switch on the first switch unit T1 to charge the common electrode 130, further, the first switch unit T1 and the second switch unit T2 are not opened at same time.

Next, the timing of the respective signals of the array substrate 10 are introduced. For convenience of description, the adjacent gate line units 110 will be described as an example.

Wherein, the adjacent gate line units 110 were the N-th gate line unit and the N+1-th gate line unit. The first gate electrode signal received by the first gate line 111 in the N-th gate line unit 110 is represented by G-1, and the second gate electrode signal received by the second gate line 112 in the N-th gate line unit 110 is represented by G-2. The first gate electrode signal received by the first gate line 111 in the N+1-th gate line unit 110 is represented by G-3, and the second gate electrode signal received by the second gate line 112 in the N+1-th gate line unit 110 is represented by G-4. The first gate electrode signal G-1 in the N-th gate line unit 110, the second gate electrode signal G-2 in the N-th gate line unit 110, the first gate electrode signal G-3 in the N+1-th gate line unit 110 and the second gate electrode signal G-4 in the N+1-th gate line unit 110 can be generated by a shift register. The trigger signal in the shift register is represented by STV in the FIG. 2. The trigger signal is used to trigger the shift register open, in the present embodiment, the shift register is a high trigger device, the trigger signal STV is a high level signal, the duration of the trigger signal is equal to the duration of the high level in a period of the clock signal, further, the raising edge of the trigger signal is corresponded to the raising edge of the clock signal and the falling edge of the trigger signal is corresponded to the falling edge of the clock signal.

After the shift register is opened by the trigger signal, outputting the signal of G-1, G-2, G-3 and G-4. The first gate electrode signal and the second gate electrode signal are high level signal, further, the duration of the high level of the first gate electrode signal, the duration of the high level of the second gate electrode signal and the duration of the high level of the trigger signal, the duration of the high level of the first gate electrode signal is greater than the duration of the high level in a period of the data and common multiplexing signal. For a same gate line unit 110, the delay time of the second gate electrode signal compared to the first gate line unit is equal to the duration of the high level of the first gate electrode signal.

In the present embodiment, the falling edge of the high level of the first gate electrode signal is corresponded to the raising edge of the high level of the second gate electrode signal. For all of the first gate line 111 and the second gate line 112 in the gate line unit 110, the delay time of the first gate electrode signal of the first gate line 111 in the N-th gate line unit 110 compared to the second gate electrode signal of the second gate line 112 in the N-th gate line unit 110 is equal to the duration of the high level of the first gate electrode signal, wherein, the N is a natural number. In the present disclosure, the falling edge of the high level of the first gate electrode signal of the first gate line 111 in the N+1-th gate line unit 110 is corresponded the raising edge of the high level of the second gate electrode signal of the second gate line 112 in the N-th gate line unit 110.

The clock signal of the shift register in the FIG. 2 is represented by CLK, the clock signal is a square wave signal. The data and common multiplexing signal in the FIG. 2 is represented by Com/Data, the data and common multiplexing signal is a rectangular wave signal, in a period of the rectangular wave signal, the duration of the high level of the rectangular wave of the data and common multiplexing signal is greater than the duration of the low level of the rectangular wave. Further, in a period of the data and common multiplexing signal, the raising edge of the high level of the data and common multiplexing signal compared to the falling edge of the clock signal has a first preset time delay, the falling edge of the low level of the data and common multiplexing signal compared to the raising edge of the low level signal in a same period of the clock signal has a second preset time advance. Wherein, the sum of the first preset time and the second preset time is equal to the duration of the low level in a period of the data and common multiplexing signal. And it is seen in FIG. 2, the duration in a period of the data and common multiplexing signal is equal to the duration of the low level of the clock signal.

Compared to the prior art, the array substrate 10 of the present disclosure includes a plurality of data and common signal multiplexing line 120, the data and common signal multiplexing line 120 receives the data and common multiplexing signal, the data and common multiplexing signal, the first gate electrode signal and the second gate electrode signal are used to control the first switch T1 and the second switch T2 in the same pixel region (pixel unit) not open at same time, thus, the array substrate 10 of the present disclosure is not need as in the prior art using the public electro line and the gate electro line generated by the same layer, therefore, the array substrate of the present disclosure reducing the number of metal lines, increasing the transmittance of the array substrate 10 and the aperture ratio of the array substrate 10.

Figure 3:
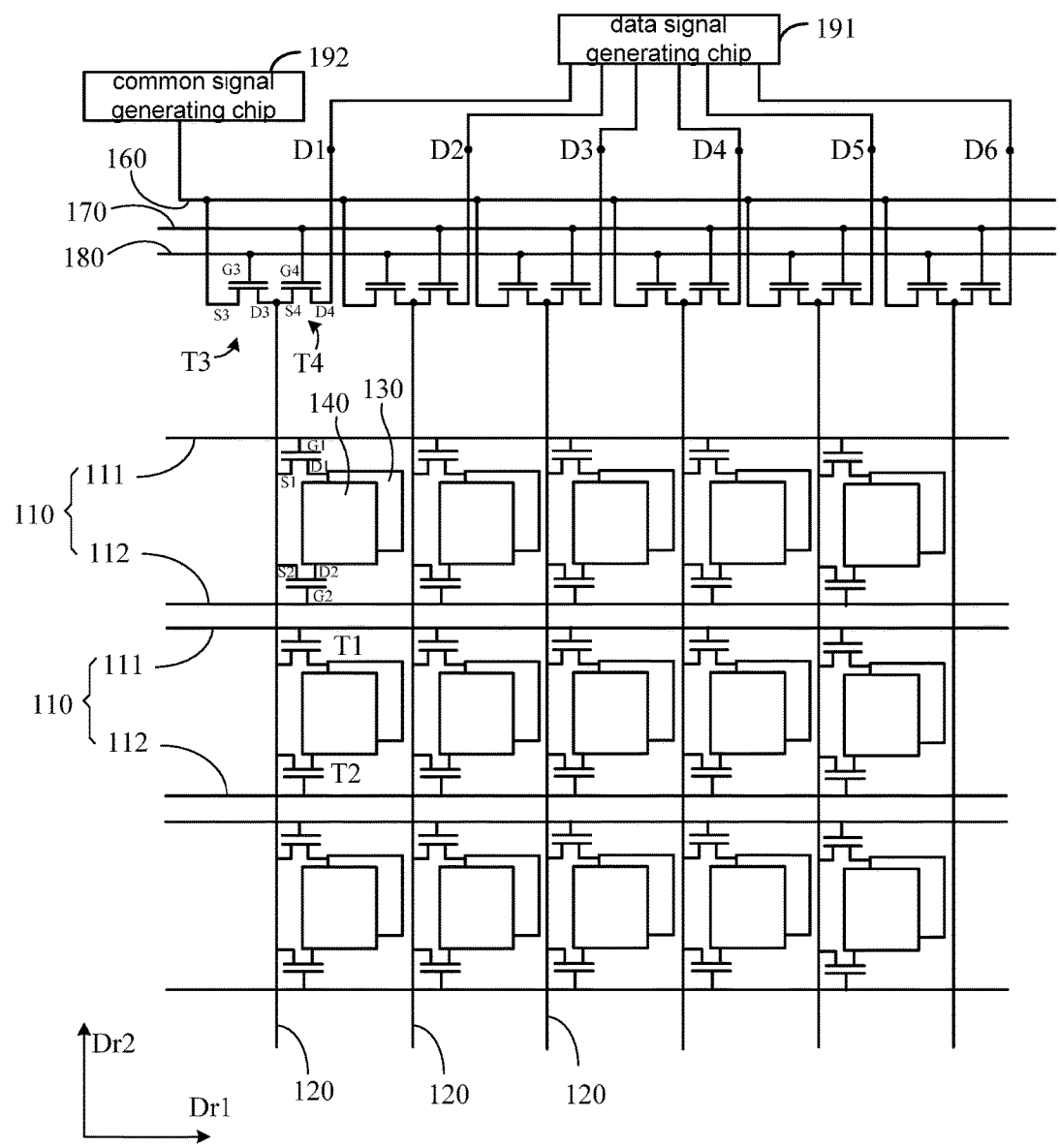
FIG. 3 is a schematic structural view of another preferred embodiment of the array substrate of the present disclosure.
Figure 4:
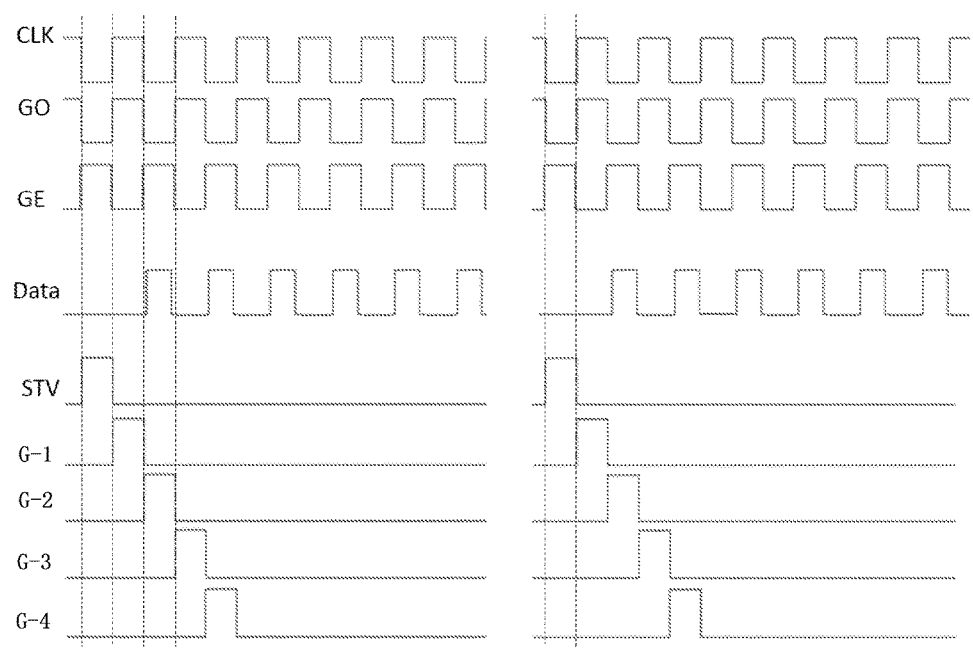
FIG. 4 is a timing diagram of each signal of the array substrate in the FIG. 3.

Please refer to FIG. 3 and FIG. 4, FIG. 3 is a schematic structural view of another preferred embodiment of the array substrate of the present disclosure; FIG. 4 is a timing diagram of each signal of the array substrate in the FIG. 3. In the present embodiment, the array substrate 10 further includes signal switching units 150. Each signal switching unit 150 connects a data and common signal multiplexing line 120. The signal switching unit 150 is used to receive the common signal and the data signal, and a data and common multiplexing signal is generated by the common signal and the data signal. Wherein, the common signal, the first gate electrode signal and the second gate electrode signal are used to switch on the first switch unit and charge the common electrode 130; the data signal, the first gate electrode signal and the second gate electrode signal are used to switch on the second switch unit T2 and charge the pixel electrode 140.

Next, the timing of the respective signals of the array substrate 10 are introduced, refer to FIG. 4, for convenience of description, the adjacent gate line units 110 will be described as an example. Wherein, the adjacent gate line units 110 were the N-th gate line unit and the N+1-th gate line unit. The first gate electrode signal received by the first gate line 111 in the N-th gate line unit 110 is represented by G-1, and the second gate electrode signal received by the second gate line 112 in the N-th gate line unit 110 is represented by G-2. The first gate electrode signal received by the first gate line 111 in the N+1-th gate line unit 110 is represented by G-3, and the second gate electrode signal received by the second gate line 112 in the N+1-th gate line unit 110 is represented by G-4. The first gate electrode signal G-1 in the N-th gate line unit 110, the second gate electrode signal G-2 in the N-th gate line unit 110, the first gate electrode signal G-3 in the N+1-th gate line unit 110 and the second gate electrode signal G-4 in the N+1-th gate line unit 110 can be generated by a shift register. The trigger signal in the shift register is represented by SW in the FIG. 4.

The trigger signal is used to trigger the shift register open, in the present embodiment, the shift register is a high trigger device, the trigger signal STV is a high level signal, the duration of the trigger signal is equal to the duration of the high level in a period of the clock signal, further, the raising edge of the trigger signal is corresponded to the raising edge of the clock signal and the falling edge of the trigger signal is corresponded to the falling edge of the clock signal.

After the shift register is opened by the trigger signal, outputting the signal of G-1, G-2, G-3 and G-4. The first gate electrode signal and the second gate electrode signal are high level signal, further, the duration of the high level of the first gate electrode signal, the duration of the high level of the second gate electrode signal and the duration of the high level of the trigger signal, the duration of the high level of the first gate electrode signal is greater than the duration of the high level in a period of the data and common multiplexing signal. For a same gate line unit 110, the delay time of the second gate electrode signal compared to the first gate line unit is equal to the duration of the high level of the first gate electrode signal.

In the present embodiment, the falling edge of the high level of the first gate electrode signal is corresponded to the raising edge of the high level of the second gate electrode signal.

For all of the first gate line 111 and the second gate line 112 in the gate line unit 110, the delay time of the first gate electrode signal of the first gate line 111 in the N-th gate line unit 110 compared to the second gate electrode signal of the second gate line 112 in the N-th gate line unit 110 is equal to the duration of the high level of the first gate electrode signal, wherein, the N is a natural number. In the present disclosure, the falling edge of the high level of the first gate electrode signal of the first gate line 111 in the N+1-th gate line unit 110 is corresponded the raising edge of the high level of the second gate electrode signal of the second gate line 112 in the N-th gate line unit 110.

The clock signal of the shift register in the FIG. 4 is represented by CLK, the clock signal is a square wave signal. In the FIG. 4, the data signal is represented by Data, the first signal is represented by GO, the second signal is represented by GE. The first signal is a square wave signal equal to the clock signal, the second signal is the inverted signal through the first signal. The data signal is a rectangular wave signal, in a period of the rectangular wave, the duration of the high level of the rectangular wave is less than the duration of the low level of the rectangular wave. In a period of the data signal, the raising edge of the high level of the data line compared to the falling edge of the high level of the clock signal has a first preset threshold time delay, the falling edge of the high level of the data line compared to the raising edge of the next high level of the clock signal has a second preset threshold time advance.

The array substrate further includes a common electrode line 160, a first signal line 170 and a second signal line 180. Correspondingly, the signal switching unit 150 includes a plurality of switch group 151. The common electrode line 160 is used to receive the common signal, the first signal line 170 is used to receive the first signal, the first signal is a rectangular wave signal, and the second signal line 180 is used to receive the second signal. Wherein, the second signal is the inverted signal through the first signal. The switch group 151 includes a third switch unit T3 and a fourth switch unit T4. The third switch unit T3 includes a third gate electrode G3, a third source electrode S3 and a third drain electrode D3. The third gate electrode G3 connects the first signal line 170, the third source electrode S3 connects the data and common signal multiplexing line 120, the third drain electrode D3 is used to receive the data signal. The fourth switch unit T4 includes a fourth gate electrode G4, a fourth source electrode S4 and a fourth drain electrode D4. The fourth gate electrode G4 connects the second signal line 180, the fourth source electrode S4 connects the common electrode line 160 to receive the common signal, and the fourth drain electrode D4 connects the third drain electrode D3.

The signal switching unit 150, the common electrode line 160, the first signal line 170 and the second signal line 180 are on the non-display area corresponding to the array substrate 10.

In an embodiment, the array substrate 10 further includes a data signal generating chip 191 and a common signal generating chip 192. The data signal generating chip 191 is used to generate the data signal, each pin of the data signal generating chip 191 is represented by D1-D6 in the FIG. 3, the common signal generating chip 192 is used to generate the common signal, and the data signal generating chip 191 and the common signal generating chip 192 are on the non-display area of the array substrate 10.

Figure 5:
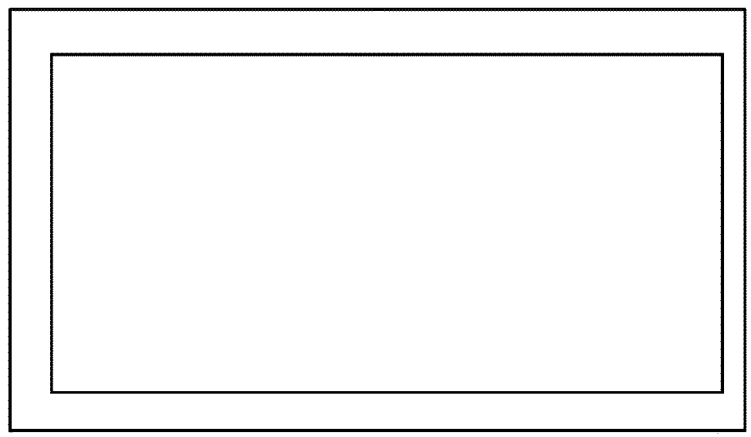
FIG. 5 is a schematic structural view of a preferred embodiment of the liquid crystal display panel of the present disclosure.

The present disclosure further provides a liquid crystal display panel 1, please refer to FIG. 5, the FIG. 5 is a schematic structural view of a preferred embodiment of the liquid crystal display panel of the present disclosure. The liquid crystal display panel 1 includes any of the array substrate 10 of the above embodiment, not discussed here.

The above disclosed only a preferred embodiment of the present disclosure only, of course, not in order to define the scope of rights of the present disclosure, those of ordinary skill in achieving the above embodiments can be understood that all or part of the process, and in accordance with the disclosure of claim made identical change, which is still covered by the scope of the disclosure.

What is claimed is:

1. An array substrate, wherein, the array substrate comprises a plurality of gate line units and a plurality of data and common signal multiplexing lines; the plurality of gate line units are extend the first direction and are arranged spaced along the second direction, each gate line unit comprises a first gate line and a second gate line; the data and common signal multiplexing lines are extend to the second direction and are arranged spaced along the first direction; the adjacent data and common signal multiplexing lines and the first gate line and the second gate line in the gate line unit form a pixel region; a first switch unit, a second switch unit, a common electrode and a pixel electrode are arranged in the pixel region; the first switch unit comprises a first gate electrode, a first source electrode and a first drain electrode; the second switch unit comprises a second gate electrode, a second source electrode and a second drain electrode; the first gate electrode connects the first gate line to receive a first gate electrode signal; the second gate electrode connects the second gate line to receive a second gate electrode signal; the first source electrode and the second source electrode are connected to form the same data and common signal multiplexing line of the pixel region, the first drain electrode connects the common electrode, the second drain electrode connects the pixel electrode; wherein, the pixel electrode is arranged with the common electrode in an insulated mode; the data and common signal multiplexing line is used to receive the data and common multiplexing signal; the data and common multiplexing signal, the first gate electrode signal and the second gate electrode signal are used to control the first switch unit and the second switch unit not opened at same time.

2. The array substrate according to claim 1, wherein, the data and common multiplexing signal, the first gate electrode signal and the second gate electrode signal are used to switch on the first switch unit first to charge the common electrode, then open the second switch unit to charge the pixel electrode.

3. The array substrate according to claim 1, wherein, the data and common multiplexing signal, the first gate electrode signal and the second gate electrode signal are used to switch on the second switch unit first to charge the pixel electrode, then switch on the first switch unit to charge the common electrode.

4. The array substrate according to claim 1, wherein, the data and common multiplexing signal is a rectangular wave signal; in a period of the rectangular wave, the duration of the high level of the rectangular wave is greater than the duration of the low level of the rectangular wave; the first gate electrode signal and the second electrode signal are high level signal and the duration of the high level of the first gate electrode signal and the second electrode signal are equal; the duration of the high level of the first gate electrode signal is greater than the duration of the high level in a period of the data and common multiplexing signal, and a gate line for the same unit; the delay time of the second gate electrode signal compared to the first gate electrode signal is equal to the duration of the high level of the first gate electrode signal.

5. The array substrate according to claim 4, wherein, the array substrate further comprises a signal switching unit; each signal switching unit connects a data and common signal multiplexing line; the signal switching unit is used to receive a common signal and a data signal; and the data and common multiplexing signal is generated by the common signal and the data signal; wherein, the common signal, the first gate electrode signal and the second gate electrode signal are used to control the first switch unit to charge the common electrode; the data signal, the first gate electrode signal and the second gate electrode signal are used to control the second switch unit to charge the pixel electrode.

6. The array substrate according to claim 5, wherein, the data signal is a rectangular wave signal; in a period of the rectangular wave, the duration of the high level of the rectangular wave is less than the duration of the low level of the rectangular wave.

7. The array substrate according to claim 5, wherein, the array substrate comprises a common electrode line, a first signal line and a second signal line; the signal switching unit comprises a plurality of switching groups, the common electrode line is used to receive the common signal, the first signal line is used to receive the first signal, the first signal is a square wave signal, the second signal line is used to receive the second signal, wherein, the second signal is an inverted signal through the first signal, the switching groups comprises a third switch unit and a fourth switch unit, the third switch unit comprises a third gate electrode, a third source electrode and a third drain electrode, the third gate electrode connects the first signal line, the third source electrode connects the data and common signal multiplexing line, the third drain electrode is used to receive the data signal, the fourth switch unit comprises a fourth gate electrode, a fourth source electrode and a fourth drain electrode, the fourth gate electrode connects the second signal, the fourth source electrode connects the common electrode line for receiving the common signal, the fourth drain connects the third drain electrode.

8. The array substrate according to claim 7, wherein, the signal switching unit, the common electrode line, the first signal line and the second signal line are on the non-display area of the array substrate.

9. The array substrate according to claim 7, wherein, the array substrate comprises a data signal generating chip and a common signal generating chip; the data signal generating chip is used to generate the data signal, the common signal generating chip is used to generate the common signal, the data signal generating chip and the common signal generating chip are on the non-display area of the array substrate.

10. A liquid crystal display panel, wherein, the liquid crystal display panel comprises an array substrate; the array substrate comprises a plurality of gate line units and a plurality of data and common signal multiplexing lines; the plurality of gate line units are extend the first direction and are arranged spaced along the second direction, each gate line unit comprises a first gate line and a second gate line; the data and common signal multiplexing lines are extend to the second direction and are arranged spaced along the first direction; the adjacent data and common signal multiplexing lines and the first gate line and the second gate line in the gate line unit form a pixel region; a first switch unit, a second switch unit, a common electrode and a pixel electrode are arranged in the pixel region; the first switch unit comprises a first gate electrode, a first source electrode and a first drain electrode; the second switch unit comprises a second gate electrode, a second source electrode and a second drain electrode; the first gate electrode connects the first gate line to receive a first gate electrode signal; the second gate electrode connects the second gate line to receive a second gate electrode signal; the first source electrode and the second source electrode are connected to form the same data and common signal multiplexing line of the pixel region, the first drain electrode connects the common electrode, the second drain electrode connects the pixel electrode; wherein, the pixel electrode is arranged with the common electrode in an insulated mode; the data and common signal multiplexing line is used to receive the data and common multiplexing signal; the data and common multiplexing signal, the first gate electrode signal and the second gate electrode signal are used to control the first switch unit and the second switch unit not opened at same time.

11. The liquid crystal display panel according to claim 10, wherein, the data and common multiplexing signal, the first gate electrode signal and the second gate electrode signal are used to switch on the first switch unit first to charge the common electrode, then open the second switch unit to charge the pixel electrode.

12. The liquid crystal display panel according to claim 10, wherein, the data and common multiplexing signal, the first gate electrode signal and the second gate electrode signal are used to switch on the second switch unit first to charge the pixel electrode, then switch on the first switch unit to charge the common electrode.

13. The liquid crystal display panel according to claim 10, wherein, the data and common multiplexing signal is a rectangular wave signal; in a period of the rectangular wave, the duration of the high level of the rectangular wave is greater than the duration of the low level of the rectangular wave; the first gate electrode signal and the second electrode signal are high level signal and the duration of the high level of the first gate electrode signal and the second electrode signal are equal; the duration of the high level of the first gate electrode signal is greater than the duration of the high level in a period of the data and common multiplexing signal, and a gate line for the same unit; the delay time of the second gate electrode signal compared to the first gate electrode signal is equal to the duration of the high level of the first gate electrode signal.

14. The liquid crystal display panel according to claim 13, wherein, the array substrate further comprises a signal switching unit; each signal switching unit connects a data and common signal multiplexing line; the signal switching unit is used to receive a common signal and a data signal; and the data and common multiplexing signal is generated by the common signal and the data signal; wherein, the common signal, the first gate electrode signal and the second gate electrode signal are used to control the first switch unit to charge the common electrode; the data signal, the first gate electrode signal and the second gate electrode signal are used to control the second switch unit to charge the pixel electrode.

15. The liquid crystal display panel according to claim 14, wherein, the data signal is a rectangular wave signal; in a period of the rectangular wave, the duration of the high level of the rectangular wave is less than the duration of the low level of the rectangular wave.

16. The liquid crystal display panel according to claim 14, wherein, the array substrate comprises a common electrode line, a first signal line and a second signal line; the signal switching unit comprises a plurality of switching groups, the common electrode line is used to receive the common signal, the first signal line is used to receive the first signal, the first signal is a square wave signal, the second signal line is used to receive the second signal, wherein, the second signal is an inverted signal through the first signal, the switching groups comprises a third switch unit and a fourth switch unit, the third switch unit comprises a third gate electrode, a third source electrode and a third drain electrode, the third gate electrode connects the first signal line, the third source electrode connects the data and common signal multiplexing line, the third drain electrode is used to receive the data signal, the fourth switch unit comprises a fourth gate electrode, a fourth source electrode and a fourth drain electrode, the fourth gate electrode connects the second signal, the fourth source electrode connects the common electrode line for receiving the common signal, the fourth drain connects the third drain electrode.

17. The liquid crystal display panel according to claim 16, wherein, the signal switching unit, the common electrode line, the first signal line and the second signal line are on the non-display area of the array substrate.

18. The liquid crystal display panel according to claim 16, wherein, the array substrate comprises a data signal generating chip and a common signal generating chip; the data signal generating chip is used to generate the data signal, the common signal generating chip is used to generate the common signal, the data signal generating chip and the common signal generating chip are on the non-display area of the array substrate.

* * * * *